United States Patent
Oh et al.

(10) Patent No.: US 11,101,002 B2
(45) Date of Patent: Aug. 24, 2021

(54) SEMICONDUCTOR MEMORY DEVICE INCLUDING CACHE LATCH CIRCUIT

(71) Applicant: SK hynix Inc., Icheon-si (KR)

(72) Inventors: Sung Lae Oh, Cheongju-si (KR); Dong Hyuk Kim, Seoul (KR); Tae Sung Park, Icheon-si (KR); Soo Nam Jung, Seoul (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/810,774

(22) Filed: Mar. 5, 2020

(65) Prior Publication Data

US 2021/0074367 A1    Mar. 11, 2021

(30) Foreign Application Priority Data

Sep. 5, 2019 (KR) .................. 10-2019-0109995

(51) Int. Cl.
| | | |
|---|---|---|
| G11C 16/04 | (2006.01) | |
| G11C 16/26 | (2006.01) | |
| H01L 25/065 | (2006.01) | |
| H01L 25/18 | (2006.01) | |
| H01L 23/00 | (2006.01) | |
| G06F 12/0895 | (2016.01) | |

(52) U.S. Cl.
CPC .......... *G11C 16/26* (2013.01); *G06F 12/0895* (2013.01); *G11C 16/0483* (2013.01); *H01L 24/08* (2013.01); *H01L 25/0657* (2013.01); *H01L 25/18* (2013.01); *G06F 2212/60* (2013.01); *H01L 2224/08145* (2013.01); *H01L 2225/06524* (2013.01); *H01L 2924/1431* (2013.01); *H01L 2924/14511* (2013.01)

(58) Field of Classification Search
CPC ..... G11C 16/26; G11C 16/0483; H01L 24/08; H01L 25/0657; H01L 25/18; H01L 2224/08145; H01L 2225/06524
See application file for complete search history.

(56) References Cited

U.S. PATENT DOCUMENTS

| | | | | |
|---|---|---|---|---|
| 8,127,078 | B2 * | 2/2012 | Gschwind | G06F 12/0886 711/118 |
| 9,460,793 | B1 | 10/2016 | Oh et al. | |
| 9,965,388 | B2 * | 5/2018 | Chun | G11C 16/10 |
| 10,319,416 | B2 * | 6/2019 | Oh | G11C 7/106 |
| 10,789,172 | B2 * | 9/2020 | Oh | G06F 12/0893 |

\* cited by examiner

*Primary Examiner* — Pho M Luu

(57) ABSTRACT

A semiconductor memory device includes a memory cell array; a page buffer circuit including a plurality of page buffers which are coupled to the memory cell array through a plurality of bit lines which extend in a second direction intersecting with a first direction; and a cache latch circuit including a plurality of cache latches which are coupled to the plurality of page buffers. The plurality of cache latches have a two-dimensional arrangement in the first direction and the second direction. Among the plurality of cache latches, an even cache latch and an odd cache latch which share a data line and an inverted data line are disposed adjacent to each other in the first direction.

17 Claims, 12 Drawing Sheets

FIG.3

| | | | |
|---|---|---|---|
| HV (4-stage) | | HV (4-stage) | |
| LV (2-stage) | LV (2-stage) | LV (2-stage) | LV (2-stage) |
| Cache | Cache | Cache | Cache |
| Cache | Cache | Cache | Cache |
| Cache | Cache | Cache | Cache |
| Cache | Cache | Cache | Cache |
| LV (2-stage) | LV (2-stage) | LV (2-stage) | LV (2-stage) |
| HV (4-stage) | | HV (4-stage) | |
| HV (4-stage) | | HV (4-stage_) | |
| LV (2-stage) | LV (2-stage) | LV (2-stage) | LV (2-stage) |
| Cache | Cache | Cache | Cache |
| Cache | Cache | Cache | Cache |
| Cache | Cache | Cache | Cache |
| Cache | Cache | Cache | Cache |
| LV (2-stage) | LV (2-stage) | LV (2-stage) | LV (2-stage) |
| HV (4-stage) | | HV (4-stage) | |
| HV (4-stage) | | HV (4-stage_) | |
| LV (2-stage) | LV (2-stage) | LV (2-stage) | LV (2-stage) |
| Cache | Cache | Cache | Cache |
| Cache | Cache | Cache | Cache |
| Cache | Cache | Cache | Cache |
| Cache | Cache | Cache | Cache |
| LV (2-stage) | LV (2-stage) | LV (2-stage) | LV (2-stage) |
| HV (4-stage) | | HV (4-stage) | |

R1, R2, R3

· · ·

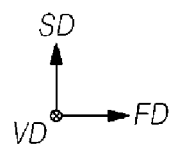

FIG.4
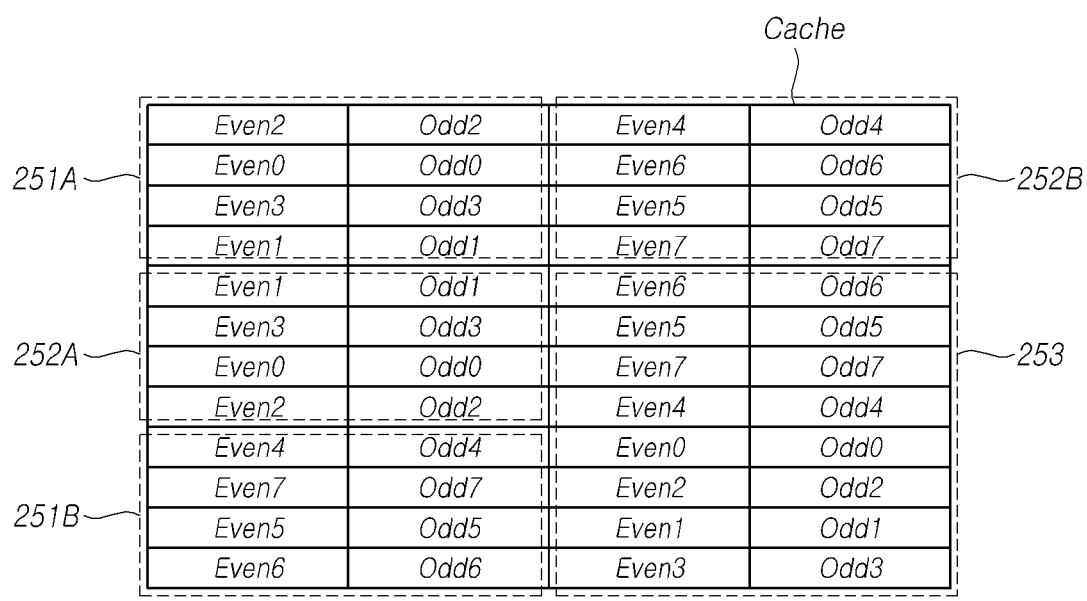

SEMICONDUCTOR MEMORY DEVICE INCLUDING CACHE LATCH CIRCUIT

CROSS-REFERENCE TO RELATED APPLICATION

The present application claims priority under 35 U.S.C. § 119(a) to Korean Patent Application No. 10-2019-0109995 filed in the Korean Intellectual Property Office on Sep. 5, 2019, which is incorporated herein by reference in its entirety.

BACKGROUND

1. Technical Field

Various embodiments generally relate to a semiconductor memory device, and particularly, to a semiconductor memory device including a cache latch circuit.

2. Related Art

In a volatile memory device, write and read speeds are high, but stored data may be lost if power supply is interrupted. In a nonvolatile memory device, write and read speeds are relatively low, but stored data may be retained even though power supply is interrupted. Therefore, in order to store data which should be retained regardless of power supply, a nonvolatile memory device is used. Nonvolatile memory devices include a read only memory (ROM), a mask ROM (MROM), a programmable ROM (PROM), an erasable programmable ROM (EPROM), an electrically erasable and programmable ROM (EEPROM), a flash memory, a phase change random access memory (PRAM), a magnetic RAM (MRAM), a resistive RAM (RRAM), and an ferroelectric RAM (FRAM). Flash memories may be classified into a NOR type and a NAND type.

Among nonvolatile memory devices, a NAND flash memory device is widely used as a data storage device. The NAND flash memory device may perform operations necessary to read and output data stored in memory cells, by using a page buffer circuit and a cache latch circuit.

SUMMARY

Various embodiments are directed to a semiconductor memory device capable of improving data output speed.

In an embodiment, a semiconductor memory device may include: a memory cell array; a page buffer circuit including a plurality of page buffers which are coupled to the memory cell array through a plurality of bit lines which extend in a second direction intersecting with a first direction; and a cache latch circuit including a plurality of cache latches which are coupled to the plurality of page buffers. The plurality of cache latches may have a two-dimensional arrangement in the first direction and the second direction. Among the plurality of cache latches, an even cache latch and an odd cache latch which share a data line and an inverted data line may be disposed adjacent to each other in the first direction.

In an embodiment, a semiconductor memory device may include: a plurality of cache latches accessed to a memory cell array through a plurality of bit lines which extend in a second direction intersecting with a first direction, and including a first cache latch and a second cache latch which are disposed in the second direction; a local sense amplifier disposed between the first cache latch and the second cache latch; and a plurality of column selection sections including a first column selection section, which is disposed between the local sense amplifier and the first cache latch, and is coupled to the first cache latch through a first wiring line, and a second column selection section, which is disposed between the local sense amplifier and the second cache latch, and is coupled to the second cache latch through a second wiring line. The first wiring line and the second wiring line may not overlap with the local sense amplifier in a vertical direction perpendicular to the first direction and the second direction.

BRIEF DESCRIPTION OF THE DRAWINGS

FIG. 3 is a top view illustrating an example of a layout of page buffers and cache latches in accordance with an embodiment of the disclosure.

FIG. 4 is a top view illustrating an example of a layout of cache latches of a semiconductor memory device in accordance with an embodiment of the disclosure.

DETAILED DESCRIPTION

Figure 1:
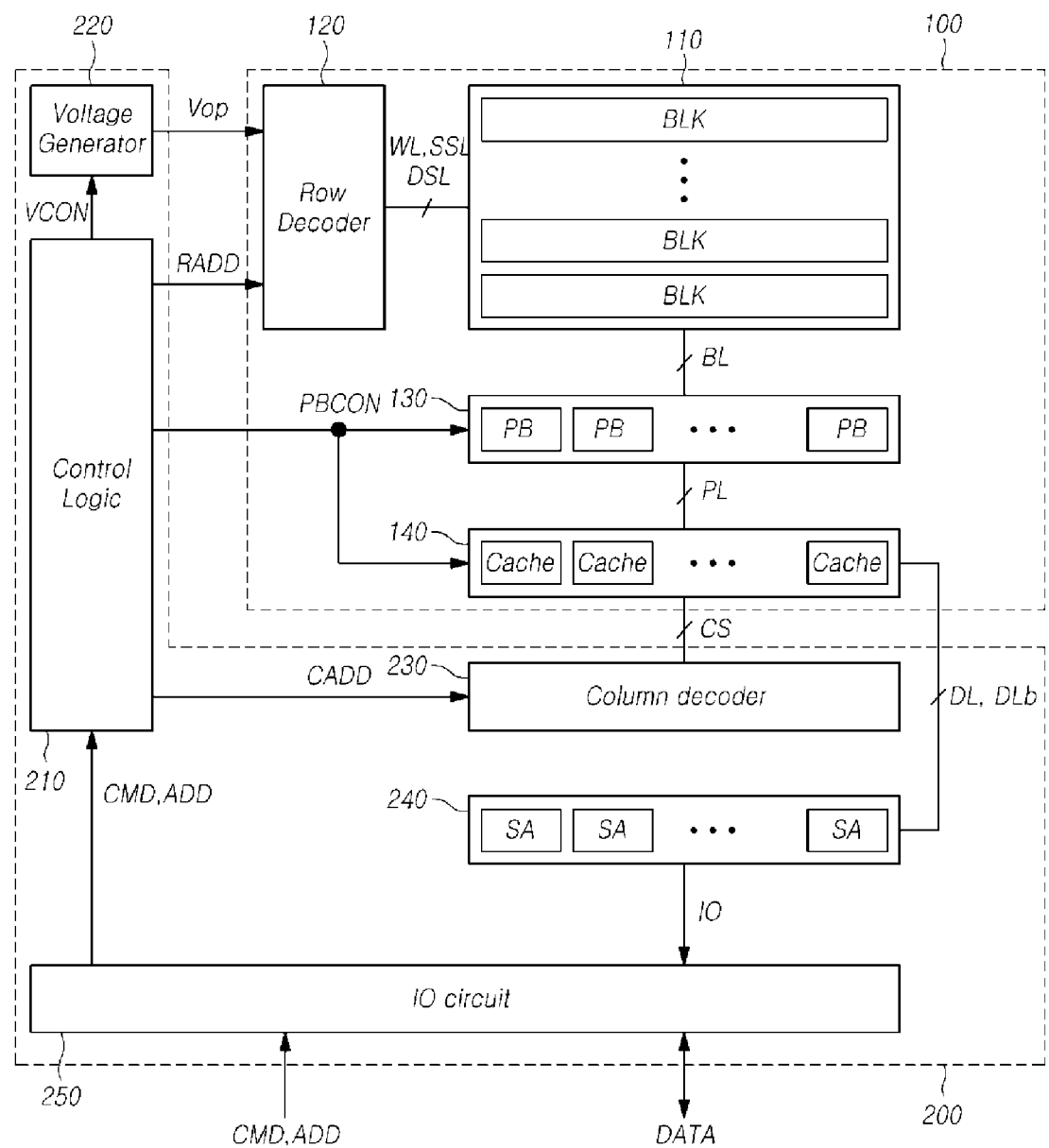
FIG. 1 is a block diagram illustrating an example of a memory device in accordance with an embodiment of the disclosure.

Advantages and features of the disclosure and methods to achieve them will become apparent from the descriptions of exemplary embodiments herein below and described with reference to the accompanying drawings. However, the present disclosure is not limited to the exemplary embodiments disclosed herein but may be implemented in various different ways. The exemplary embodiments of the present disclosure convey the scope of the disclosure to those skilled in the art.

The figures, dimensions, ratios, angles, numbers of elements given in the drawings that describe embodiments of the disclosure are merely illustrative and are not limiting. Throughout the specification, like reference numerals refer to like elements. In describing the disclosure, when it is determined that a detailed description of the known related art may obscure the gist or clarity of the disclosure, the detailed description thereof will be omitted. It is to be understood that the terms "comprising," "having," "including" and so on, used in the description and claims, should not be interpreted as being restricted to the means listed thereafter unless specifically stated otherwise. Where an indefinite or definite article is used when referring to a singular noun (e.g. "a," "an," "the"), the article may include a plural of that noun unless specifically stated otherwise.

Elements in embodiments of the disclosure should be interpreted as including error margins even without explicit statements.

Also, in describing the components of the disclosure, there may be terms used like first, second, A, B, (a), and (b). These are solely for the purpose of differentiating one component from the other and do not to imply or suggest the substances, order, sequence or number of the components. Also, elements in embodiments of the disclosure are not limited by these terms. These terms are used to merely distinguish one element from another. Accordingly, as used herein, a first element may be a second element within the technical idea of the disclosure.

If a component is described as "connected," "coupled" or "linked" to another component, it may mean that the component is not only directly "connected," "coupled" or "linked" but also is indirectly "connected," "coupled" or "linked" via a third component. In describing positional relationship, such as "an element A on an element B," "an element A above an element B," "an element A below an element B" and "an element A next to an element B," another element C may be disposed between the elements A and B unless the term "directly" or "immediately" is explicitly used.

Features of various exemplary embodiments of the disclosure may be coupled, combined or separated partially or totally. Technically various interactions and operations are possible. Various exemplary embodiments can be practiced individually or in combination.

Hereinafter, various examples of embodiments of the disclosure will be described in detail with reference to the accompanying drawings.

FIG. 1 is a block diagram illustrating a representation of an example of a memory device in accordance with an embodiment of the disclosure.

Referring to FIG. 1, the memory device in accordance with an embodiment of the disclosure may include a core block 100 and a peripheral circuit block 200. The core block 100 may include a memory cell array 110, a row decoder 120, a page buffer circuit 130 and a cache latch circuit 140. The peripheral circuit block 200 may include a control logic 210, a voltage generator 220, a column decoder 230, a sense amplifier group 240 and an input/output circuit 250.

The memory cell array 110 may be coupled to the row decoder 120 through word lines WL and select lines DSL and SSL. The select lines DSL and SSL may include drain select lines DSL and source select lines SSL. The memory cell array 110 may be coupled to the page buffer circuit 130 through bit lines BL. The memory cell array 110 may store data received through the page buffer circuit 130, in a program operation, and may transmit stored data to the page buffer circuit 130, in a read operation.

The memory cell array 110 may include a plurality of memory blocks BLK. Memory block BLK may correspond to an erase unit. Word lines WL and select lines DSL and SSL may be coupled to each of the memory blocks BLK. Bit lines BL may be coupled in common to a plurality of memory blocks BLK. The circuit configuration of the memory blocks BLK will be described below with reference to FIG. 2.

The row decoder 120 may select one among the memory blocks BLK of the memory cell array 110, in response to a row address signal RADD from the control logic 210. The row decoder 120 may transfer operating voltages Vop from the voltage generator 220, to the word lines WL and the select lines DSL and SSL coupled to a selected memory block BLK.

The page buffer circuit 130 may include a plurality of page buffers PB which are coupled to the memory cell array 110 through the bit lines BL. Each of the page buffers PB may detect data stored in a memory cell of the memory cell array 110 by sensing the signal of a bit line BL of the memory cell array 110 in response to a page buffer control signal PBCON, and may transmit a signal depending on the detected data to the cache latch circuit 140 through a page line PL. The page buffer PB may apply a signal to the bit line BL based on data received through the cache latch circuit 140, in response to the page buffer control signal PBCON, and thereby, may write data to a memory cell of the memory cell array 110. The page buffer PB may write or read data to or from a memory cell which is coupled to a word line activated by the row decoder 120.

The cache latch circuit 140 may include a plurality of cache latches Cache which are coupled with the page buffers PB through page lines PL. The cache latches Cache will be described later with reference to FIGS. 3 to 6.

The control logic 210 may output a voltage control signal VCON for generating voltages necessary for the operation of the memory device, in response to a command CMD inputted through the input/output circuit 250. The control logic 210 may output the page buffer control signal PBCON for controlling the page buffer circuit 130 and the cache latch circuit 140, in response to the command CMD. The control logic 210 may generate the row address signal RADD and a column address signal CADD in response to an address signal ADD inputted through the input/output circuit 250.

The voltage generator 220 may generate various operating voltages Vop to be used in a program, read or erase operation, in response to the voltage control signal VCON from the control logic 210. For example, the voltage generator 220 may generate program voltages, pass voltages, read voltages and erase voltages in response to the voltage control signal VCON.

The column decoder 230 may generate a column select signal CS for selecting the cache latches Cache included in the cache latch circuit 140, in response to the column address signal CADD from the control logic 210. For instance, the column decoder 230 may generate the column select signal CS in response to the column address signal CADD such that data latched in some cache latches Cache, selected from among the cache latches Cache by the column address signal CADD, may be outputted to the sense amplifier group 240.

The sense amplifier group 240 may include a plurality of local sense amplifiers SA. Each of the local sense amplifiers SA may be coupled to the cache latch circuit 140 through a pair of data line DL and inverted data line DLb, and may output data, obtained by amplifying the voltage difference between the data line DL and the inverted data line DLb, to input/output pins IO. The input/output circuit 250 may output data, provided from the sense amplifier group 240, to the outside.

Because the local sense amplifier SA outputs data by amplifying the voltage difference between the data line DL and the inverted data line DLb, the faster the speed at which the data line DL and the inverted data line DLb are developed, the more the data output speed may be improved. In order to increase the speed at which the data line DL and the inverted data line DLb are developed, it is necessary to reduce the loading of the data line DL and the inverted data line DLb. Embodiments of the disclosure may propose a method capable of reducing the loading of the data line DL and the inverted data line DLb.

Figure 2:
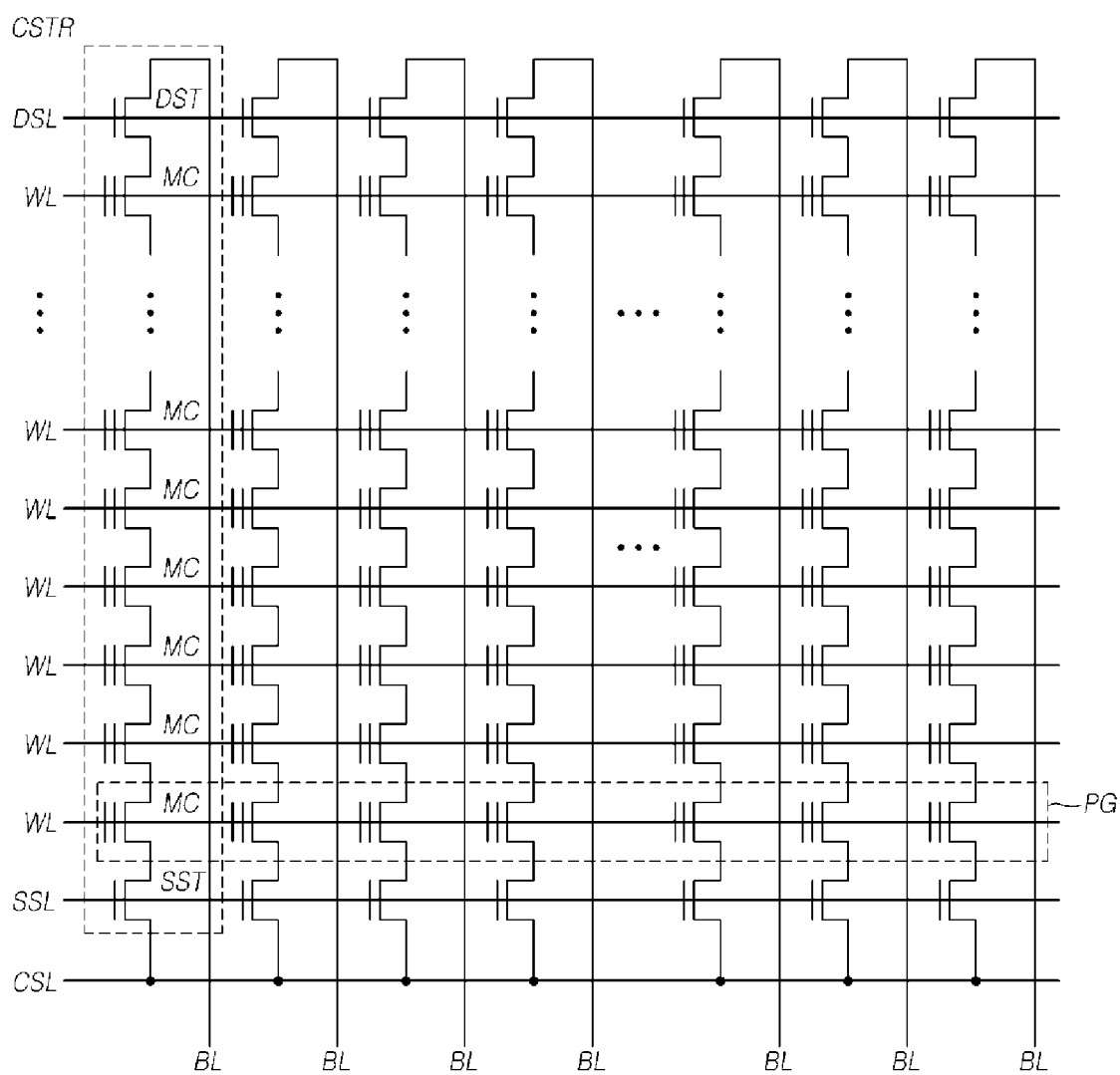
FIG. 2 is an equivalent circuit diagram illustrating an example of one of memory blocks illustrated in FIG. 1.

FIG. 2 is an equivalent circuit diagram illustrating an example of one of the memory blocks BLK illustrated in FIG. 1.

Referring to FIG. 2, the memory block BLK may include a plurality of cell strings CSTR which are coupled between the plurality of bit lines BL and a common source line CSL.

Each of the cell strings CSTR may be coupled between a corresponding bit line BL and the common source line CSL. Each of the cell strings CSTR may include a source select transistor SST which is coupled to the common source line CSL, a drain select transistor DST which is coupled to the bit line BL, and a plurality of memory cells MC which are coupled between the source select transistor SST and the drain select transistor DST. The gate of the source select transistor SST may be coupled to a source select line SSL. The gates of the memory cells MC may be coupled to corresponding word lines WL, respectively. The gate of the drain select transistor DST may be coupled to a drain select line DSL.

The source select line SSL, the word lines WL and the drain select line DSL may be disposed in a direction perpendicular or substantially perpendicular to the bit lines BL. The source select line SSL, the word lines WL and the drain select line DSL may form a three-dimensional structure by being stacked in a vertical direction on the top surface of a substrate.

The memory cells MC included in the memory block BLK may be divided into physical page units or logical page units. For example, memory cells MC which share one word line WL and are coupled to different cell strings CSTR may configure one physical page PG.

FIG. 3 is a top view illustrating an example of a layout of page buffers and cache latches in accordance with an embodiment of the disclosure.

Referring to FIG. 3, the page buffer circuit 130 (see FIG. 1) may include a plurality of bit line selection sections HV and a plurality of sensing latches LV. The bit line selection sections HV may be coupled to the memory cell array 110 (see FIG. 1) through bit lines. The sensing latches LV may be coupled to the bit lines through the bit line selection sections HV, and may exchange data with a plurality of cell strings coupled to the bit lines. Each page buffer may be configured with one of the bit line selection sections HV and one of the sensing latches LV.

Cache latches Cache may be coupled to the sensing latches LV through page lines, and may exchange data with the sensing latches LV. If a read command is received, then data stored in the memory cell array 110 may be read and temporarily stored by the sensing latches LV, and then, may be transmitted through the page lines to and stored in the cache latches Cache. Data stored in the cache latches Cache may be transferred to a local sense amplifier group through data lines, and may then be outputted to the outside through an input/output circuit.

Due to a decrease in the pitch of the bit lines attributable to process miniaturization, the bit line selection sections HV may be two-dimensionally arranged in a first direction FD and a second direction SD, and may be arranged in a plurality of stages in the second direction SD. Also, the sensing latches LV and the cache latches Cache may be two-dimensionally arranged in the first direction FD and the second direction SD, and may be arranged in a plurality of stages in the second direction SD. For instance, the bit line selection sections HV may be arranged in 24 stages in the second direction SD, the sensing latches LV may be arranged in 12 stages in the second direction SD, and the cache latches Cache may be arranged in 12 stages in the second direction SD.

In order to simplify the structure and shorten the length of wiring lines which couple the bit line selection sections HV and the sensing latches LV, and wiring lines which couple the sensing latches LV and the cache latches Cache, the stages of the bit line selection sections HV (hereinafter referred to as 'bit line selection section stages'), the stages of the sensing latches LV (hereinafter referred to as 'sensing latch stages') and the stages of the cache latches Cache (hereinafter referred to as 'cache latch stages') may be disposed by being divided into a plurality of groups. For instance, four cache latch stages, four sensing latch stages and eight bit line selection section stages may configure one group. The cache latch stages, the sensing latch stages and the bit line selection section stages may be disposed in group units in a plurality of regions R1 to R3, which are provided in the second direction SD. Four cache latch stages may be disposed at the center portion of each of the regions R1 to R3, four sensing latch stages may be disposed two by two on both sides of the cache latch stages in the second direction SD, and eight bit line selection section stages may be disposed four by four on both sides of the sensing latch stages in the second direction SD.

FIG. 4 is a top view illustrating an example of a layout of cache latches of a semiconductor memory device in accordance with an embodiment of the disclosure.

The Input/Output paths IO (see FIG. 1) may be configured by 2k (where k is a natural number), for example, eight input/output pins. In the case where the input/output paths are configured by eight input/output pins, the input/output paths may be defined as IO<0> to IO<7>.

FIG. 4 illustrates the input/output pins, among the eight input/output pins, through which respective cache latches Cache exchange data. When even cache latches are coupled to an even bit line are designated as 'Even #' (where # is an integer equal to or greater than 0) and odd cache latches coupled to an odd bit line are designated as 'Odd #,' the even cache latches Even # may exchange data by being coupled to the input/output paths IO<0> to IO<7>, respectively, in a sequence in which the number # increases. Also, the odd cache latches Odd # may exchange data by being coupled to the input/output paths IO<0> to IO<7>, respectively, in a sequence in which the number # increases.

In the case where eight even cache latches Even0 to Even7 or eight odd cache latches Odd0 to Odd7 are allocated to the eight input/output pins, the eight even cache latches Even0 to Even7 or the eight odd cache latches Odd0 to Odd7 may configure one column selection coding. Data stored in eight cache latches included in one column selection coding may be simultaneously outputted in parallel when outputting data. Eight cache latches included in one column selection coding may configure one input/output cache latch group.

When assuming that 16 cache latches are included in a first cache latch group 251, eight even cache latches Even0 to Even7 and eight odd cache latches Odd0 to Odd7 may be included in the first cache latch group 251. In the first cache latch group 251, the eight even cache latches Even0 to Even7 may configure one input/output cache latch group, and the eight odd cache latches Odd0 to Odd7 may configure one input/output cache latch group. That is to say, the first cache latch group 251 may configure two input/output cache latch groups.

An even cache latch Even # and an odd cache latch Odd # which are included in the same cache latch group and have the same number # may be paired with each other, and may be disposed adjacent to each other in the first direction FD. While not illustrated, an even cache latch Even # and an odd cache latch Odd # which are paired with each other may share a data line and an inverted data line. A structure in which a data line and an inverted data line are shared will be described hereunder with reference to FIG. 5.

Figure 5:
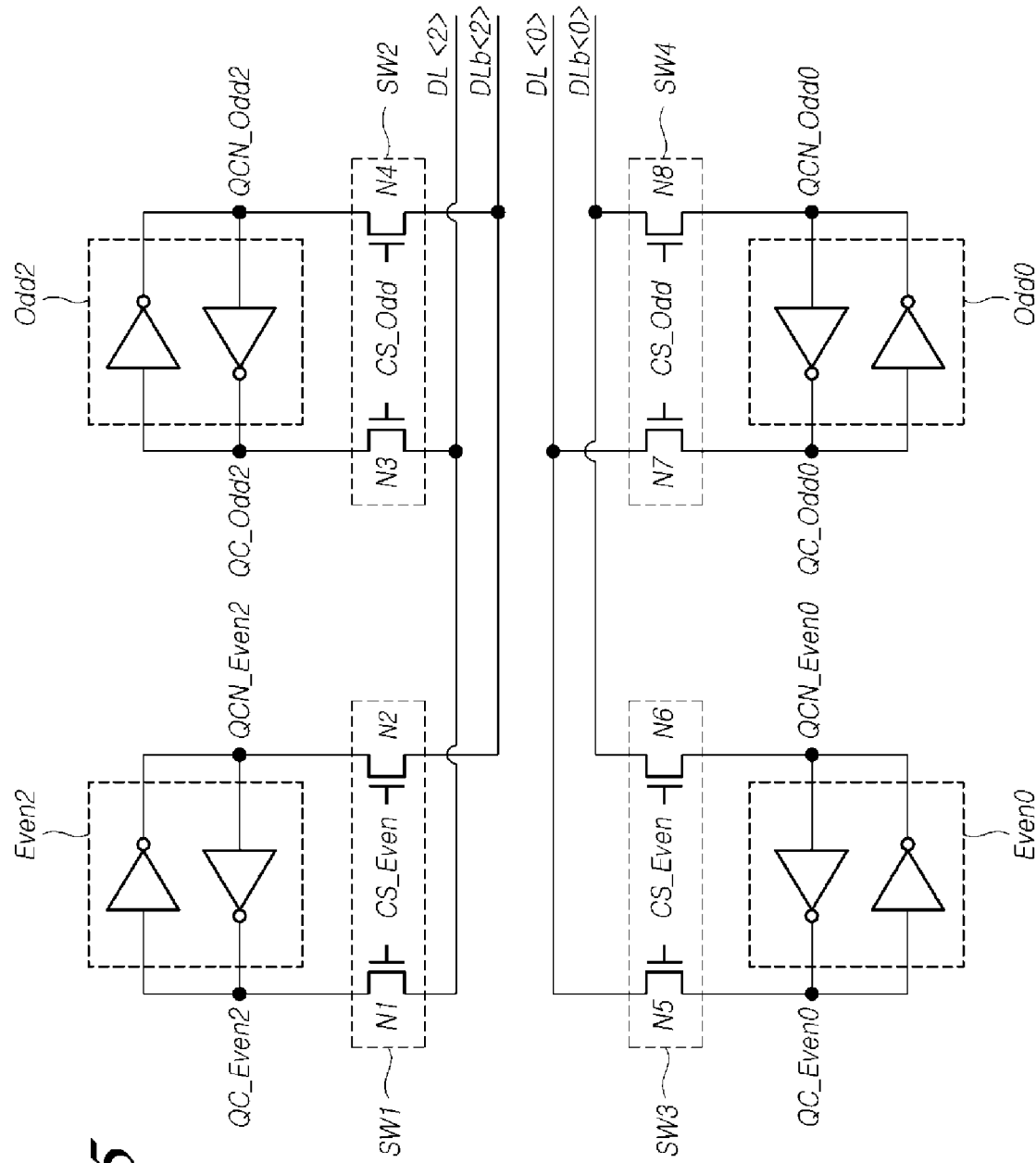
FIG. 5 is a circuit diagram illustrating an example of a part of a cache latch circuit of a semiconductor memory device in accordance with an embodiment of the disclosure.

FIG. 5 is a circuit diagram illustrating an example of a part of a cache latch circuit of a semiconductor memory device in accordance with an embodiment of the disclosure.

Referring to FIG. 5, a cache latch circuit may include cache latches Even2, Odd2, Even0 and Odd0 and column selection sections SW1 to SW4. The cache latches Even2, Odd2, Even0 and Odd0 may perform a latch based on data transferred from sensing latches.

A non-inverting node QC_Even2 and an inverting node QCN_Even2 of the even cache latch Even2 may be coupled to a data line DL<2> and an inverted data line DLb<2>, respectively, through the column selection section SW1. A non-inverting node QC_Odd2 and an inverting node QCN_Odd2 of the odd cache latch Odd2 may be coupled to the data line DL<2> and the inverted data line DLb<2>, respectively, through the column selection section SW2. The even cache latch Even2 and the odd cache latch Odd2 may be paired with each other, and may share the data line DL<2> and the inverted data line DLb<2>.

The column selection section SW1 may include first and second transistors N1 and N2. The first transistor N1 may be coupled between the non-inverting node QC_Even2 of the even cache latch Even2 and the data line DL<2>, and may operate in response to a column select signal CS_Even. The second transistor N2 may be coupled between the inverting node QCN_Even2 of the even cache latch Even2 and the inverted data line DLb<2>, and may operate in response to the column select signal CS_Even.

The column selection section SW2 may include third and fourth transistors N3 and N4. The third transistor N3 may be coupled between the non-inverting node QC_Odd2 of the odd cache latch Odd2 and the data line DL<2>, and may operate in response to a column select signal CS_Odd. The fourth transistor N4 may be coupled between the inverting node QCN_Odd2 of the odd cache latch Odd2 and the inverted data line DLb<2>, and may operate in response to the column select signal CS_Odd.

A non-inverting node QC_Even0 and an inverting node QCN_Even0 of the even cache latch Even0 may be coupled to a data line DL<0> and an inverted data line DLb<0>, respectively, through the column selection section SW3. A non-inverting node QC_Odd0 and an inverting node QCN_Odd0 of the odd cache latch Odd0 may be coupled to the data line DL<0> and the inverted data line DLb<0>, respectively, through the column selection section SW4. The even cache latch Even0 and the odd cache latch Odd0 may be paired with each other, and may share the data line DL<0> and the inverted data line DLb<0>.

The column selection section SW3 may include fifth and sixth transistors N5 and N6. The fifth transistor N5 may be coupled between the non-inverting node QC_Even0 of the even cache latch Even0 and the data line DL<0>, and may operate in response to the column select signal CS_Even. The sixth transistor N6 may be coupled between the invert-ing node QCN_Even0 of the even cache latch Even0 and the inverted data line DLb<0>, and may operate in response to the column select signal CS_Even.

The column selection section SW4 may include seventh and eighth transistors N7 and N8. The seventh transistor N7 may be coupled between the non-inverting node QC_Odd0 of the odd cache latch Odd0 and the data line DL<0>, and may operate in response to the column select signal CS_Odd. The eighth transistor N8 may be coupled between the inverting node QCN_Odd0 of the odd cache latch Odd0 and the inverted data line DLb<0>, and may operate in response to the column select signal CS_Odd.

If the column select signal CS_Even is activated, then the first transistor N1 may output data of the non-inverting node QC_Even2 of the even cache latch Even2 to the data line DL<2>, and the second transistor N2 may output data of the inverting node QCN_Even2 of the even cache latch Even2 to the inverted data line DLb<2>. The fifth transistor N5 may output data of the non-inverting node QC_Even0 of the even cache latch Even0 to the data line DL<0>, and the sixth transistor N6 may output data of inverting node QCN_Even0 of the even cache latch Even0 to the inverted data line DLb<0>.

If the column select signal CS_Odd is activated, then the third transistor N3 may output data of the non-inverting node QC_Odd2 of the odd cache latch Odd2 to the data line DL<2>, and the fourth transistor N4 may output data of the inverting node QCN_Odd2 of the odd cache latch Odd2 to the inverted data line DLb<2>. The seventh transistor N7 may output data of the non-inverting node QC_Odd0 of the odd cache latch Odd0 to the data line DL<0>, and the eighth transistor N8 may output data of inverting node QCN_Odd0 of the odd cache latch Odd0 to the inverted data line DLb<0>. The transistors N1 to N8 configuring the column selection sections SW1 to SW4 may be defined as non-inverted data output transistors and inverted data output transistors according to the characteristics of output data. For example, the first, third, fifth and seventh transistors N1, N3, N5 and N7 may be defined as non-inverted data output transistors, and the second, fourth, sixth and eighth transistors N2, N4, N6 and N8 may be defined as inverted data output transistors.

Figure 6:
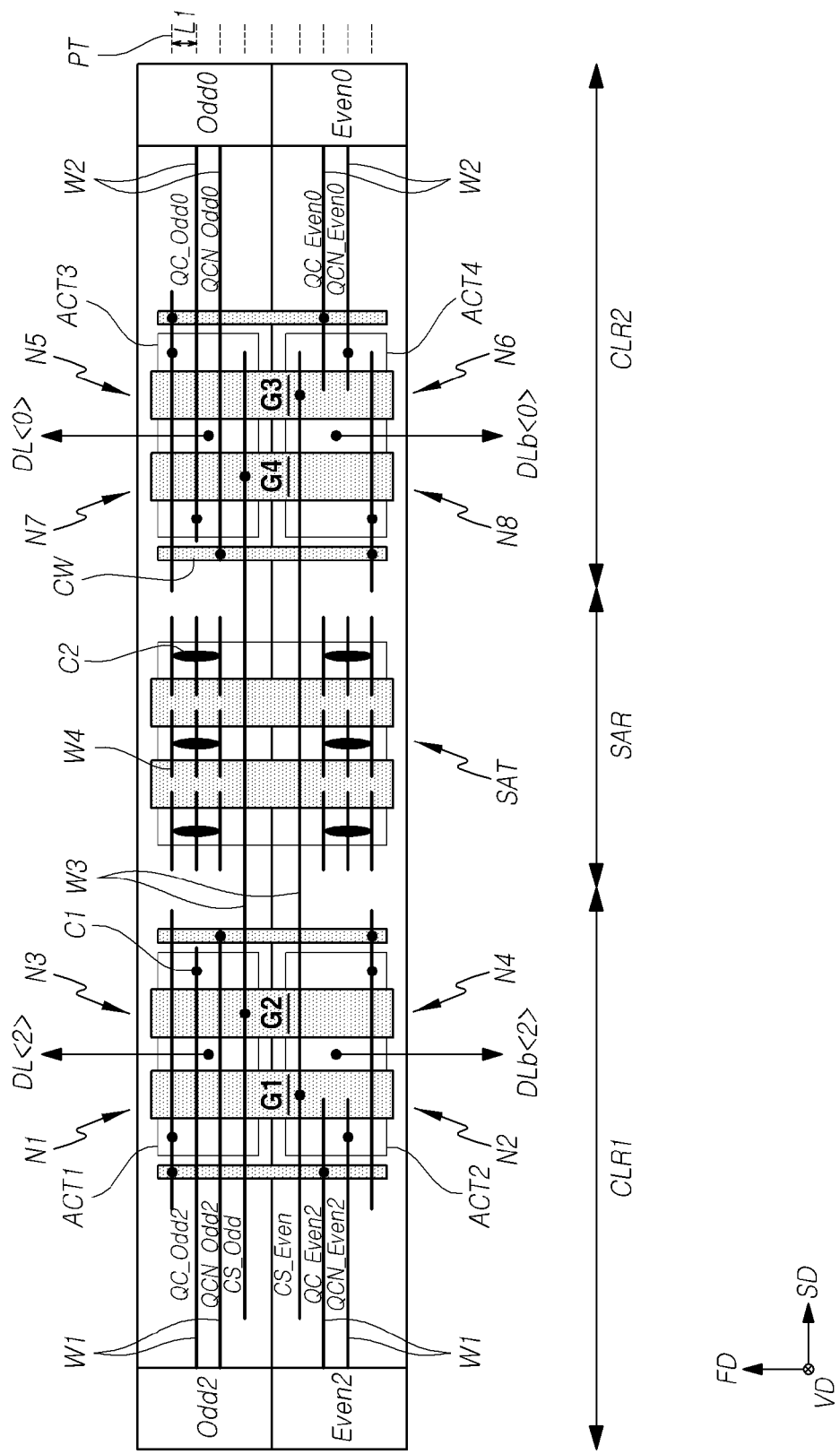
FIG. 6 is a top view illustrating an example of a part of a semiconductor memory device in accordance with an embodiment of the disclosure.

FIG. 6 is a top view illustrating an example of a part of a semiconductor memory device in accordance with an embodiment of the disclosure. FIG. 6 illustrates a configuration including the cache latches and the column selection sections of FIG. 5.

Referring to FIGS. 5 and 6, a semiconductor memory device or a substrate may include first and second cache latch regions CLR1 and CLR2 and an interval region SAR. The first cache latch region CLR1 and the second cache latch region CLR2 may be disposed in the second direction SD. The interval region SAR may be disposed between the first cache latch region CLR1 and the second cache latch region CLR2. In other words, the first cache latch region CLR1, the interval region SAR and the second cache latch region CLR2 may be disposed in sequence in the second direction SD.

In the first cache latch region CLR1, the even cache latch Even2 and the odd cache latch Odd2 may be disposed adjacent to each other in the first direction FD. A first active region ACT1 and a second active region ACT2 may be disposed in the first cache latch region CLR1. The first active region ACT1 may be disposed in the same column as the odd cache latch Odd2, and the second active region ACT2 may be disposed in the same column as the even cache latch Even2, where a column extends in a direction substantially parallel to the second direction. The first active region ACT1 and the second active region ACT2 may be disposed adjacent to each other in the first direction FD.

First and second gate lines G1 and G2, which extend in the first direction FD and intersect with the first and second active regions ACT1 and ACT2, may be defined in the first cache latch region CLR1. Impurity ions may be doped into the first and second active regions ACT1 and ACT2 on both sides of each of the first and second gate lines G1 and G2, and thereby, drain regions and source regions may be defined. The impurity ions may include arsenic (As), phosphorus (P), or the like. On the other hand, the impurity ions may include gallium (Ga), indium (In), or the like.

The first gate line G1, with the source and drain regions defined in the first active region ACT1 on both sides of the first gate line G1, may configure the first transistor N1. The second gate line G2, with the source and drain regions defined in the first active region ACT1 on both sides of the second gate line G2, may configure the third transistor N3. The first transistor N1 and the third transistor N3 may share a source region. The data line DL<2> may be coupled to the common source region of the first transistor N1 and the third transistor N3.

The first gate line G1, with the source and drain regions defined in the second active region ACT2 on both sides of the first gate line G1, may configure the second transistor N2. The second gate line G2, with the source and drain regions defined in the second active region ACT2 on both sides of the second gate line G2, may configure the fourth transistor N4. The second transistor N2 and the fourth transistor N4 may share a source region. The inverted data line DLb<2> may be coupled to the common source region of the second transistor N2 and the fourth transistor N4.

In the second cache latch region CLR2, the even cache latch Even0 and the odd cache latch Odd0 may be disposed adjacent to each other in the first direction FD. A third active region ACT3 and a fourth active region ACT4 may be defined in the second cache latch region CLR2. The third active region ACT3 may be disposed on the same column as the odd cache latch Odd0, and the fourth active region ACT4 may be disposed on the same column as the even cache latch Even0. The third active region ACT3 and the fourth active region ACT4 may be disposed adjacent to each other in the first direction FD.

Third and fourth gate lines G3 and G4, which extend in the first direction FD and intersect with the third and fourth active regions ACT3 and ACT4, may be defined in the second cache latch region CLR2. Impurity ions may be doped into the third and fourth active regions ACT3 and ACT4 on both sides of each of the third and fourth gate lines G3 and G4, and thereby, drain regions and source regions may be defined.

The third gate line G3, with the source and drain regions defined in the third active region ACT3 on both sides of the third gate line G3, may configure the fifth transistor N5. The fourth gate line G4, with the source and drain regions defined in the third active region ACT3 on both sides of the fourth gate line G4, may configure the seventh transistor N7. The fifth transistor N5 and the seventh transistor N7 may share a source region. The data line DL<0> may be coupled to the common source region of the fifth transistor N5 and the seventh transistor N7.

The third gate line G3, with the source and drain regions defined in the fourth active region ACT4 on both sides of the third gate line G3, may configure the sixth transistor N6. The fourth gate line G4, with the source and drain regions defined in the fourth active region ACT4 on both sides of the fourth gate line G4, may configure the eighth transistor N8. The sixth transistor N6 and the eighth transistor N8 may share a source region. The inverted data line DLb<0> may be coupled to the common source region of the sixth transistor N6 and the eighth transistor N8.

All of the transistors N1 to N4, which are coupled to the even cache latch Even2 and the odd cache latch Odd2, may be disposed in the first cache latch region CLR1. Similarly, all of the transistors N5 to N8, which are coupled to the even cache latch Even0 and the odd cache latch Odd0, may be disposed in the second cache latch region CLR2.

First to fourth wiring lines W1, W2, W3 and W4 may be disposed in a wiring line layer over the cache latches Even2, Odd2, Even0 and Odd0 and the transistors N1 to N8. In the wiring line layer, a plurality of wiring line tracks PT which extend in the second direction SD and are arranged in the first direction FD may be defined. The wiring line tracks PT may be virtual lines used to arrange wiring lines in the wiring line layer. The wiring line tracks PT may be arranged in the first direction FD at predetermined intervals L1. The pitch of the wiring line tracks PT may be equal to the interval L1.

The first to fourth wiring lines W1, W2, W3 and W4 may be aligned with the wiring line tracks PT. Each of center lines of the respective first to fourth wiring lines W1, W2, W3 and W4 may overlap with any one of the wiring line tracks PT. The first wiring lines W1 may provide electrical paths which couple the transistors N1 to N4 disposed in the first cache latch region CLR1 with the non-inverting nodes QC_Even2 and QC_Odd2 and with the inverting nodes QCN_Even2 and QCN_Odd2 of the cache latches Even2 and Odd2. The second wiring lines W2 may configure electrical paths which couple the transistors N5 to N8 disposed in the second cache latch region CLR2 with the non-inverting nodes QC_Even0 and QC_Odd0 and with the inverting nodes QCN_Even0 and QCN_Odd0 of the cache latches Even0 and Odd0. The third wiring lines W3 may configure electrical paths for transferring the column select signals CS_Even and CS_Odd to the gates G1 to G4 of the transistors N1 to N8.

Since the cache latches Even2 and Odd2 and the transistors N1 to N4 are disposed in the first cache latch region CLR1, the first wiring lines W1 which couple the cache latches Even2 and Odd2 and the transistors N1 to N4 may be disposed only inside the first cache latch region CLR1. The first wiring lines W1 are disposed in the first cache latch region CLR1, and are not disposed in the interval region SAR or in the second cache latch region CLR2.

Similarly, since the cache latches Even0 and Odd0 and the transistors N5 to N8 are disposed in the second cache latch region CLR2, the second wiring lines W2 which couple the cache latches Even0 and Odd0 and the transistors N5 to N8 may be disposed only inside the second cache latch region CLR2. The second wiring lines W2 are disposed in the second cache latch region CLR2, and are not disposed in the interval region SAR or in the first cache latch region CLR1.

Transistors coupled to each of cache latches may be disposed in the first direction FD. For instance, the first transistor N1 and the second transistor N2, which are coupled to the cache latch Even2, may be disposed in the first direction FD.

In the case where transistors coupled to each of cache latches are disposed in the first direction FD, at least one of the transistors coupled to each of the cache latches may not be disposed in the same column as the corresponding cache latch coupled therewith. Therefore, at least one transistor may not overlap in terms of a wiring line (either one of W1 and W2) coupled therewith. For instance, the first transistor N1 may not be disposed on the same column as the cache latch Even2, and the first wiring line W1 coupled to the cache latch Even2 may not overlap with the first transistor N1.

A transistor not overlapping with a wiring line which should be coupled therewith needs to be coupled to the wiring line using separate means. The transistor not overlapping with the wiring line which should be coupled therewith may be coupled to the wiring line through a coupling line CW. In this regard, in the case where a separate wiring line is configured to form the coupling line CW, a wiring layer may be added. Thus, the coupling line CW may be formed by not using a separate wiring line, but utilizing a configuration already existing in the cache latch circuit. For instance, the coupling line CW may be configured in a semiconductor layer or a gate layer. FIG. 6 illustrates a case where the coupling line CW is configured using a gate layer. The unexplained reference symbol C1 denotes first contacts which couple the first and second wiring lines W1 and W2 with coupling lines CW and couple the first, second and third wiring lines W1, W2 and W3 with the transistors N1 to N8.

A local sense amplifier may be disposed in the interval region SAR. FIG. 6 illustrates some of transistors SAT which configure the local sense amplifier. The transistors SAT may be coupled to the fourth wiring lines W4 through second contacts C2. The transistors SAT may be configured by transistors having a larger size than transistors configuring the cache latch circuit. In order to match contact resistance, the second contacts C2 coupled to the transistors SAT may have a critical dimension (CD) larger than the first contacts C1.

As is well known, in the case where the CD of a contact is large, as a plurality of wiring lines are coupled together to the contact, a failure in which the wiring lines are undesirably shorted may be caused. Therefore, in order to dispose the transistors SAT requiring the second contacts C2 having a larger size in the interval region SAR, the number of wiring lines which should not be coupled with the transistors SAT, among wiring lines overlapping with the transistors SAT in a vertical direction VD, needs to be reduced.

According to the present embodiment, since the first and second wiring lines W1 and W2, which should not be coupled with the transistors SAT configuring the local sense amplifier, do not overlap with the local sense amplifier, it is possible to dispose the transistors SAT of the local sense amplifier requiring the second contacts C2 having a larger size, in the interval region SAR.

Figure 7:
FIG. 7 is a top view illustrating an example of a layout of cache latches of a semiconductor memory device related with the disclosure.
Figure 8:
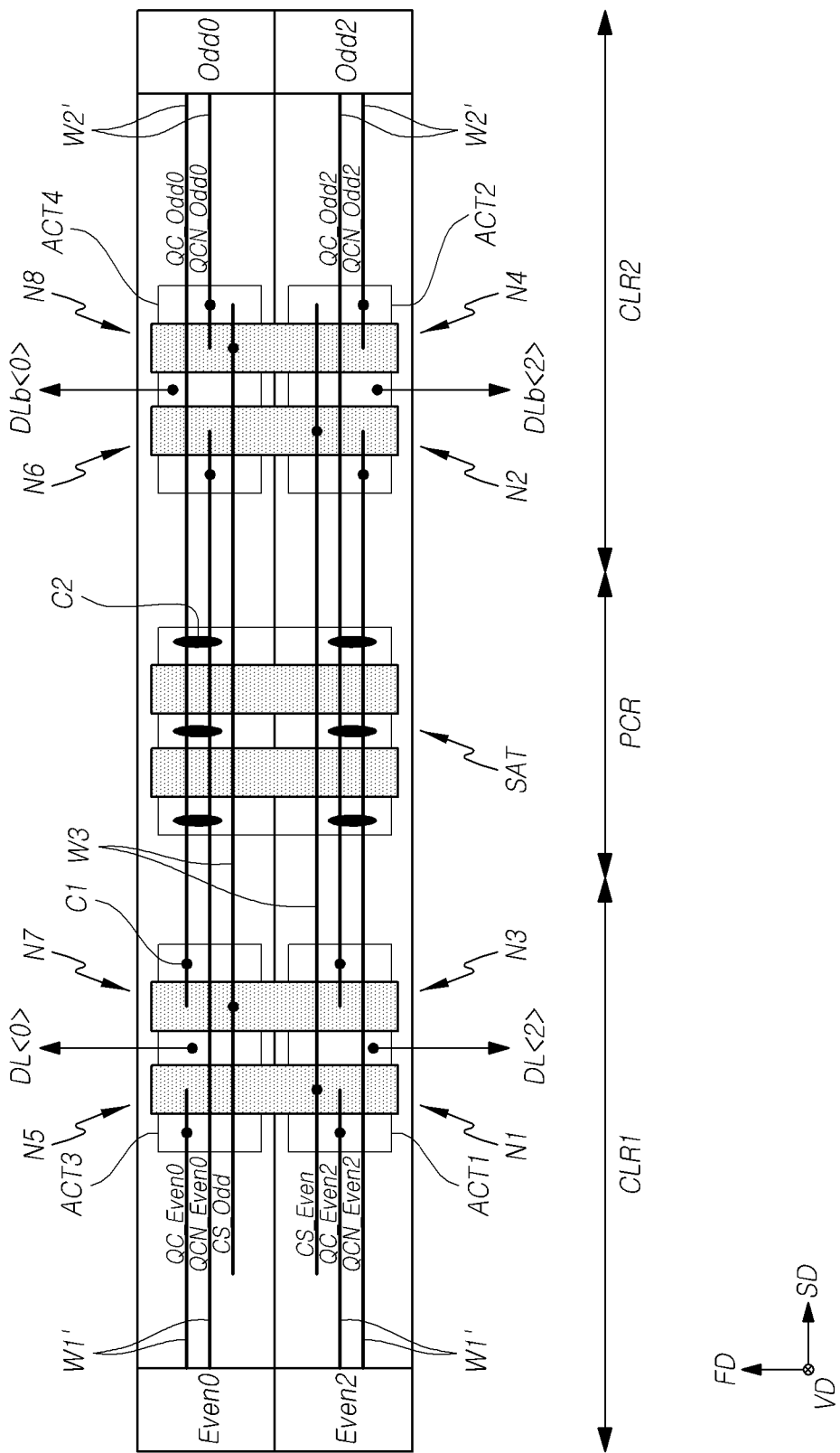
FIG. 8 is a top view illustrating an example of a part of a semiconductor memory device related with the disclosure.

FIG. 7 is a top view illustrating an example of a layout of cache latches of a semiconductor memory device related with the disclosure, and FIG. 8 is a top view illustrating an example of a part of a semiconductor memory device related with the disclosure.

Referring to FIGS. 7 and 8, an even cache latch and an odd cache latch which share a data line and an inverted data line may be disposed in the second direction SD being a column direction. For instance, an even cache latch Even2 and an odd cache latch Odd2 which share a data line DL<2> and an inverted data line DLb<2> may be disposed in the second direction SD.

In order to share the data line DL<2>, a transistor N1 which is coupled to the even cache latch Even2 and a transistor N3 which is coupled to the odd cache latch Odd2 need to be disposed in one active region. In order to share the inverted data line DLb<2>, a transistor N2 which is coupled to the even cache latch Even2 and a transistor N4 which is coupled to the odd cache latch Odd2 need to be disposed in one active region. In this case, a certain transistor N2 of the transistors N1 and N2 which are coupled to the even cache latch Even2 may be disposed in a different cache latch region from the even cache latch Even2. For example, the even cache latch Even2 may be disposed in a first cache latch region CLR1, but the transistor N2 may be disposed in a second cache latch region CLR2. Similarly, a certain transistor N3 of the transistors N3 and N4 which are coupled to the odd cache latch Odd2 may be disposed in a different cache latch region from the odd cache latch Odd2. For example, the odd cache latch Odd2 may be disposed in the second cache latch region CLR2, but the transistor N3 may be disposed in the first cache latch region CLR1.

Therefore, a wiring line W1', which couples the even cache latch Even2 and the transistor N2, needs to extend from the first cache latch region CLR1 to the second cache latch region CLR2 through an interval region SAR. Further, a wiring line W2', which couples the odd cache latch Odd2 and the transistor N3, needs to extend from the second cache latch region CLR2 to the first cache latch region CLR1 through the interval region SAR.

Due to this fact, a number of wiring lines W1', W2' and W3, which should not be coupled with transistors SAT of a local sense amplifier, will overlap with the transistors SAT in the vertical direction VD.

In order to improve data output speed, it is necessary to dispose the transistors SAT configuring the local sense amplifier in the interval region SAR and thereby reduce the length of a data line and an inverted data line. However, as illustrated in FIG. 8, if a number of wiring lines which should not be coupled with the transistors SAT of the local sense amplifier overlap with the transistors SAT of the local sense amplifier in the vertical direction VD, then it will be difficult or impossible to dispose contacts C2 having a larger size by avoiding the wiring lines, and as a result, it may be impossible to dispose the local sense amplifier requiring the contacts C2 in the interval region SAR.

As described above, according to an embodiment of the disclosure, since the first and second wiring lines W1 and W2 do not overlap with the interval region SAR where the local sense amplifier is positioned, in the vertical direction VD, it is possible to dispose the second contacts C2 having a larger size in the interval region SAR, and thus, it is possible to dispose the local sense amplifier in the interval region SAR.

Figure 9:
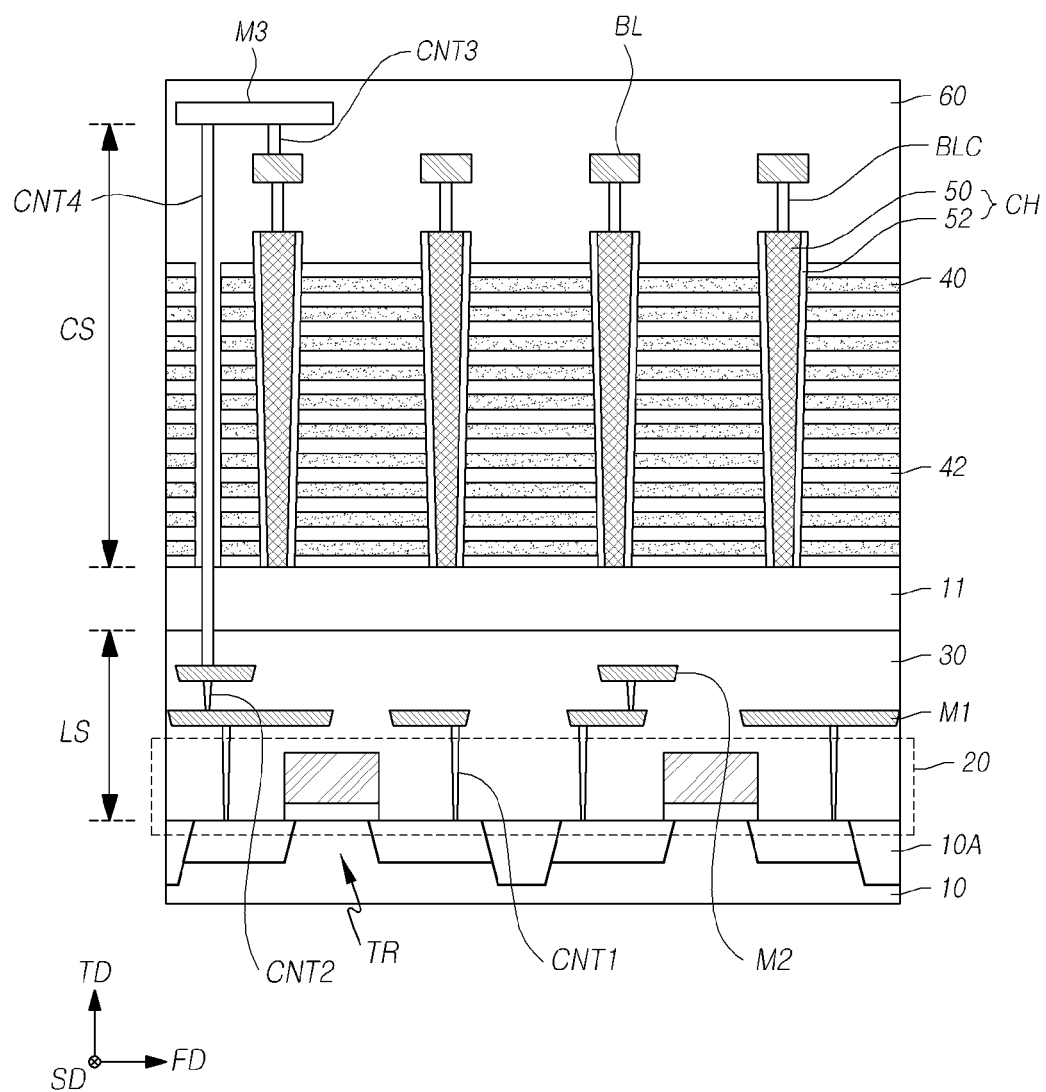
FIG. 9 is a cross-sectional view illustrating an example of a part of a semiconductor memory device in accordance with an embodiment of the disclosure.

FIG. 9 is a cross-sectional view illustrating an example of a part of a semiconductor memory device in accordance with an embodiment of the disclosure.

Referring to FIG. 9, the semiconductor memory device may have a PUC (peri under cell) structure. A logic structure LS may be disposed under a memory structure CS.

The logic structure LS may be disposed on a substrate 10, and the memory structure CS may be disposed on a source plate 11. The substrate 10 may include at least one selected from the group including a monocrystalline silicon layer, an SOI (silicon on insulator), a silicon layer formed on a silicon germanium (SiGe) layer, a monocrystalline silicon layer formed on a dielectric layer and a polysilicon layer formed on a dielectric layer. The source plate 11 may be constituted by a polysilicon layer. Unlike the substrate 10, which may use a monocrystalline silicon layer, since the source plate 11 should be formed on the logic structure LS, the source plate 11 may be constituted by a polysilicon layer.

The logic structure LS may include a logic circuit 20. The logic circuit 20 may include transistors TR that are disposed on active regions of the substrate 10 defined by an isolation layer 10A. While not illustrated, the logic circuit 20 may further include capacitors, inductors, and so forth. The logic circuit 20 may include the row decoder 120, the page buffer circuit 130, the cache latch circuit 140, the control logic 210, the voltage generator 220, the column decoder 230, the local sense amplifier group 240 and the input/output circuit 250, which are described above with reference to FIG. 1. FIG. 9 illustrates a case where bit lines BL, which are defined in the memory structure CS, are coupled to the page buffer circuit 130 which is defined in the logic structure LS.

A dielectric layer 30 may be defined on the substrate 10 to cover the logic circuit 20. The dielectric layer 30 may include silicon oxide, for example, HDP (high density plasma) oxide or TEOS (tetra-ethyl-ortho-silicate) oxide. A plurality of wiring lines M1 and M2 may be defined in the dielectric layer 30. The wiring lines M1 and M2 may include first wiring lines M1 which are defined in a first wiring layer over the logic circuit 20 and second wiring lines M2 which are defined in a second wiring layer over the first wiring layer. The first wiring lines M1 may be coupled to the logic circuit 20 through first contacts CNT1. The second wiring lines M2 may be coupled to the first wiring lines M1 through second contacts CNT2.

The memory structure CS may include a plurality of vertical channels CH which are disposed on the source plate 11, and a plurality of electrode layers 40 and a plurality of interlayer dielectric layers 42 which are alternately stacked along or around the vertical channels CH.

Among the electrode layers 40, at least one layer from the lowermost layer may constitute a source select line, and at least one layer from the uppermost layer may constitute a drain select line. The electrode layers 40 between the source select line and the drain select line may constitute word lines. The electrode layers 40 may include a conductive material. For example, the electrode layers 40 may include at least one selected among a doped semiconductor (e.g., doped silicon), a metal (e.g., tungsten, copper or aluminum), conductive metal nitride (e.g., titanium nitride or tantalum nitride) and a transition metal (e.g., titanium or tantalum). The interlayer dielectric layers 42 may include silicon oxide.

The vertical channels CH may be coupled to the source plate 11 through the electrode layers 40 and the interlayer dielectric layers 42. Each of the vertical channels CH may include a channel layer 50 and a gate dielectric layer 52. The channel layer 50 may include polysilicon or monocrystalline silicon, and may include a P-type impurity such as boron (B) in some areas thereof. The gate dielectric layer 52 may include a tunnel dielectric layer, a charge storage layer and a blocking layer which are sequentially stacked from the outer sidewall of the channel layer 50 in an inward direction. In some embodiments, the gate dielectric layer 52 may have an ONO (oxide-nitride-oxide) stack structure in which an oxide layer, a nitride layer and an oxide layer are sequentially stacked. Source select transistors, memory cells and drain select transistors may be configured where the electrode layers 40 surround the vertical channels CH. A dielectric layer 60 may be defined to cover the source plate 11, the vertical channels CH and a stack of the plurality of electrode layers 40 and the plurality of interlayer dielectric layers 41. The dielectric layer 60 may include silicon oxide, for example, HDP (high density plasma) oxide or TEOS (tetra-ethyl-ortho-silicate) oxide.

Bit lines BL and wiring lines M3 may be defined in the dielectric layer 60. The bit lines BL may be disposed over the vertical channels CH. The bit lines BL may be coupled to the channel layers 50 of the vertical channels CH through bit line contacts BLC. The wiring lines M3 may be disposed over the bit lines BL. The wiring lines M3 may be coupled to the bit lines BL through contacts CNT3, and may be coupled to the second wiring lines M2 of the logic structure LS through contacts CNT4. By this fact, electrical paths which couple the bit lines BL and the page buffer circuit of the logic structure LS may be configured.

Figure 10:
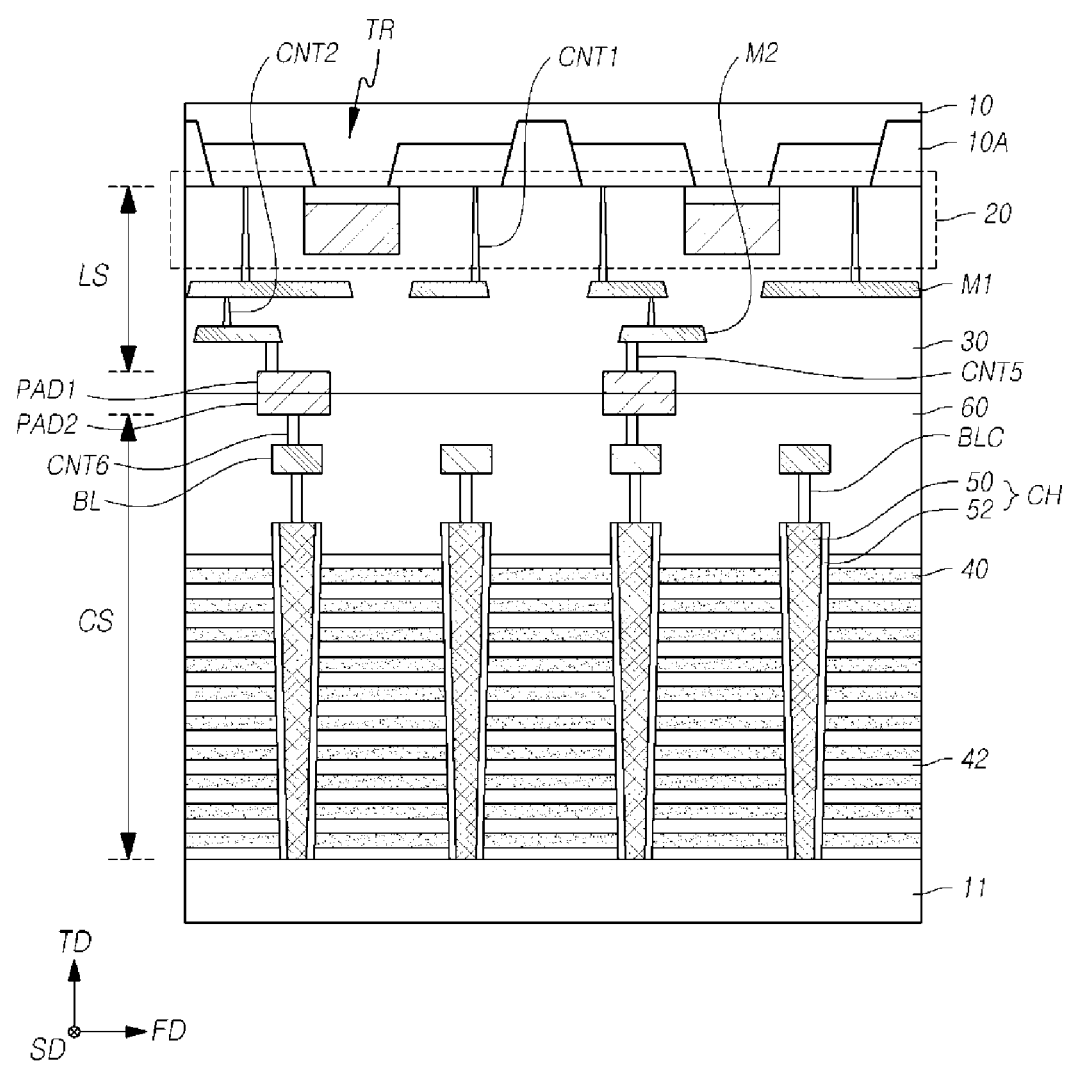
FIG. 10 is an example of a cross-sectional view to assist in the explanation of a semiconductor memory device in accordance with an embodiment of the disclosure.

FIG. 10 is a representation of an example of a cross-sectional view to assist in the explanation of a semiconductor memory device in accordance with an embodiment of the disclosure.

Referring to FIG. 10, the semiconductor memory device may have a POC (peri over cell) structure. In other words, a logic structure LS may be disposed over a memory structure CS.

The memory structure CS and the logic structure LS may be separately fabricated and be then bonded with each other. The memory structure CS may be fabricated on a source plate 11. The logic structure LS may be fabricated on a substrate 10. The substrate 10 and the source plate 11 may be formed of the same material. The substrate 10 and the source plate 11 may each include at least one selected from the group including a monocrystalline silicon layer, an SOI (silicon on insulator), a silicon layer formed on a silicon germanium (SiGe) layer, a monocrystalline silicon layer formed on a dielectric layer and a polysilicon layer formed on a dielectric layer.

First pads PAD1 may be defined on one surface of the logic structure LS. The first pads PAD1 may be coupled to a logic circuit 20 through contacts CNT5, second wiring lines M2, contacts CNT2, first wiring lines M1 and contacts CNT1. Second pads PAD2 may be defined on one surface of the memory structure CS. The second pads PAD2 may be coupled to bit lines BL through contacts CNT6.

As the one surface of the logic structure LS and the one surface of the memory structure CS are bonded with each other, the first pads PAD1 and the second pads PAD2 may be coupled with each other. Accordingly, electrical paths which couple the memory cells of the memory structure CS and the logic circuit 20 of the logic structure LS may be configured.

Figure 11:
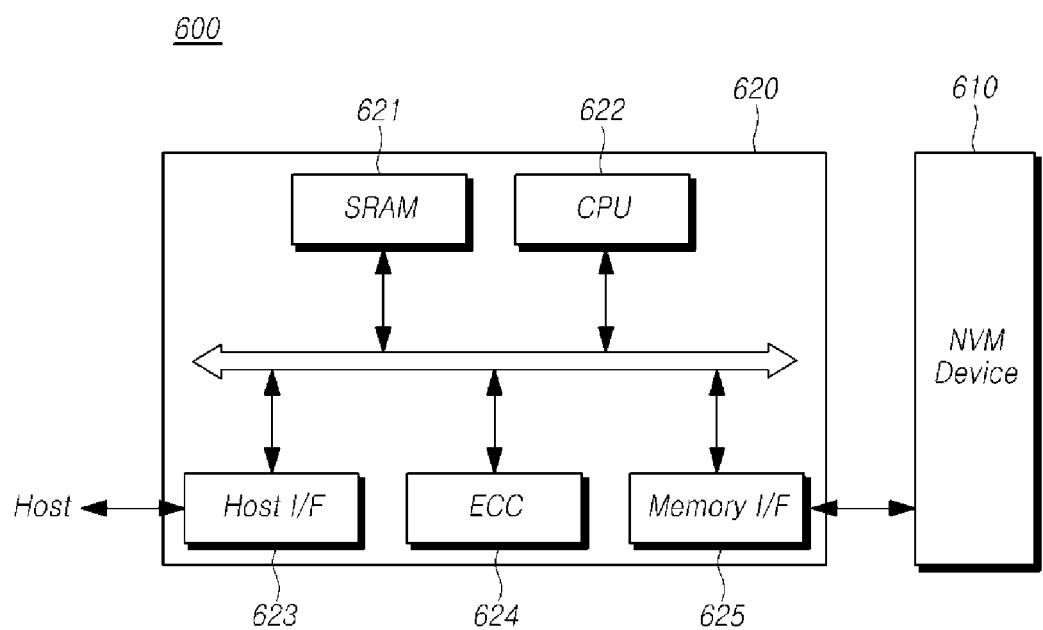
FIG. 11 is a block diagram schematically illustrating an example of a memory system including a semiconductor memory device in accordance with an embodiment of the disclosure.

FIG. 11 is a block diagram schematically illustrating an example of a memory system including a semiconductor memory device in accordance with an embodiment of the disclosure.

Referring to FIG. 11, a memory system 600 in accordance with an embodiment may include a nonvolatile memory device 610 and a memory controller 620.

The nonvolatile memory device 610 may be constituted by a semiconductor memory device described above and may operate in the manner described above. The memory controller 620 may be configured to control the nonvolatile memory device 610. The combination of the nonvolatile memory device 610 and the memory controller 620 may be configured as a memory card or a solid state disk (SSD). An SRAM 621 is used as a working memory of a processing unit 622. A host interface 623 includes a data exchange protocol of a host which is coupled with the memory system 600.

An error correction code block 624 detects and corrects an error included in data read from the nonvolatile memory device 610.

A memory interface 625 interfaces with the nonvolatile memory device 610 of the present embodiment. The processing unit 622 performs general control operations for data exchange of the memory controller 620.

Although not shown in the drawing, it is obvious to a person skilled in the art to which the embodiment pertains that the memory system 600 in accordance with the embodiment may be additionally provided with a ROM which stores code data for interfacing with the host. The nonvolatile memory device 610 may be provided as a multi-chip package which is constituted by a plurality of flash memory chips.

The memory system 600 in accordance with the embodiment, described above, may be provided as a storage medium of high reliability, which has a low probability of an error to occur. In particular, the nonvolatile memory device of the present embodiment may be included in a memory system such as a solid state disk (SSD) which is being actively studied recently. In this case, the memory controller 620 may be configured to communicate with an exterior (for example, the host) through one of various interface protocols such as a USB (universal serial bus) protocol, an MMC (multimedia card) protocol, a PCI-E (peripheral component interconnection express) protocol, an SATA (serial advanced technology attachment) protocol, a PATA (parallel advanced technology attachment) protocol, an SCSI (small computer system interface) protocol, an ESDI (enhanced small disk interface) protocol and an IDE (Integrated Device Electronics) protocol.

Figure 12:
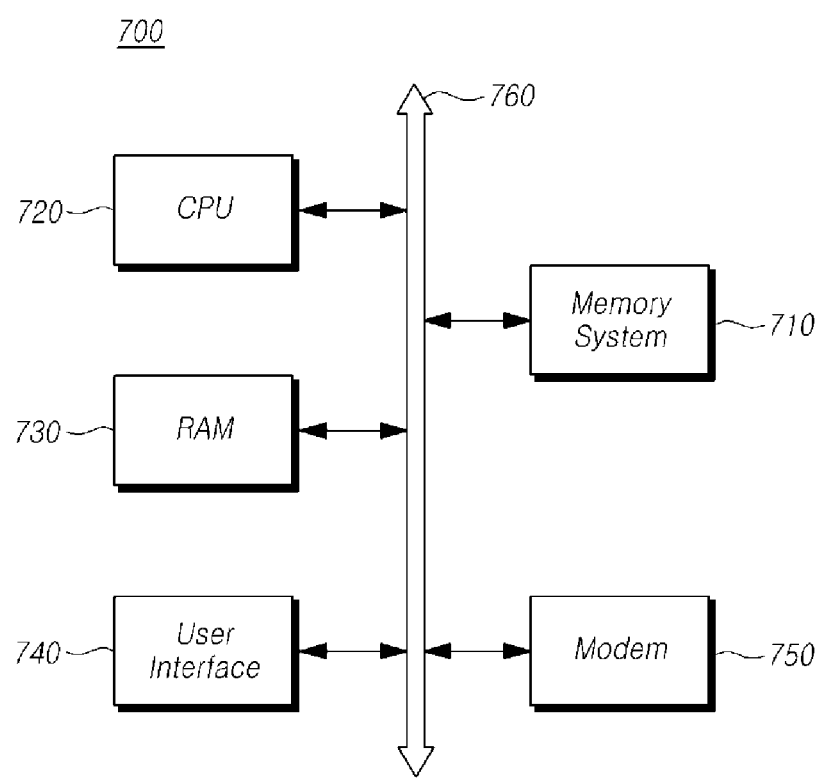
FIG. 12 is a block diagram schematically illustrating an example of a computing system including a semiconductor memory device in accordance with an embodiment of the disclosure.

FIG. 12 is a block diagram schematically illustrating an example of a computing system including a semiconductor memory device in accordance with an embodiment of the disclosure.

Referring to FIG. 12, a computing system 700 in accordance with an embodiment may include a memory system 710, a microprocessor 720, a RAM 730, a user interface 740 and a modem 750 such as a baseband chipset, which are electrically coupled to a system bus 760. In the case where the computing system 700 in accordance with the embodiment is a mobile device, a battery (not shown) for supplying the operating voltage of the computing system 700 may be additionally provided. Although not shown in the drawing, it is obvious to a person skilled in the art to which the embodiment pertains that the computing system 700 in accordance with the embodiment may be additionally provided with an application chipset, a camera image processor (CIS), a mobile DRAM, and so on. The memory system 710 may configure, for example, an SSD (solid state drive/disk) which uses a nonvolatile memory to store data. Otherwise, the memory system 710 may be provided as a fusion flash memory (for example, an OneNAND flash memory).

Although exemplary embodiments of the disclosure have been described for illustrative purposes, those skilled in the art will appreciate that various modifications, additions and substitutions are possible, without departing from the scope and spirit of the disclosure. Therefore, the embodiments disclosed above and in the accompanying drawings should be considered in a descriptive sense only and not for limiting the technological scope. The technological scope of the disclosure is not limited by the embodiments and the accompanying drawings. The spirit and scope of the disclosure may be interpreted in connection with the appended claims and encompass all equivalents falling within the scope of the appended claims.

What is claimed is:

1. A semiconductor memory device comprising:
a memory cell array;
a page buffer circuit including a plurality of page buffers which are coupled to the memory cell array through a plurality of bit lines which extend in a second direction intersecting with a first direction;
a cache latch circuit including a plurality of cache latches which are coupled to the plurality of page buffers; and
a local sense amplifier disposed between a pair of cache latches which are adjacent to each other in the second direction, and amplifies a voltage difference between a data line and an inverted data line,
wherein the plurality of cache latches have a two-dimensional arrangement in the first direction and the second direction, and
wherein, among the plurality of cache latches, an even cache latch and an odd cache latch which share the data line and the inverted data line are disposed adjacent to each other in the first direction.

2. The semiconductor memory device according to claim 1,
wherein the cache latch circuit further includes a plurality of column selection sections which are coupled to the plurality of cache latches, respectively, and
wherein each of the plurality of column selection sections comprises:
a non-inverted data output transistor coupled between a non-inverting node of one of the plurality of cache latches and the data line to output a signal of the non-inverting node to the data line in response to a column select signal; and
an inverted data output transistor coupled between an inverting node of the one cache latch and the inverted data line to output a signal of the inverting node of the one cache latch to the inverted data line in response to the column select signal.

3. The semiconductor memory device according to claim 2,
wherein a non-inverted data output transistor coupled to the even cache latch and a non-inverted data output transistor coupled to the odd cache latch are disposed in a first active region and share a source region,
wherein an inverted data output transistor coupled to the even cache latch and an inverted data output transistor coupled to the odd cache latch are disposed in a second active region and share a source region, and
wherein the data line is coupled to the source region which is shared by the non-inverted data output transistors coupled to the even cache latch and the odd cache latch, and the inverted data line is coupled to the source region which is shared by the inverted data output transistors coupled to the even cache latch and the odd cache latch.

4. The semiconductor memory device according to claim 2, wherein the non-inverted data output transistor and the inverted data output transistor included in one of the plurality of column selection sections are disposed adjacent to each other in the first direction.

5. The semiconductor memory device according to claim 2, wherein one of the non-inverted data output transistor and the inverted data output transistor coupled to one of the plurality of cache latches is disposed in the same column as the one cache latch, and the other is disposed in a different column from the one cache latch.

6. The semiconductor memory device according to claim 5, wherein the transistor which is disposed in the same column as the one cache latch is coupled to the one cache latch through a wiring line extending in the second direction.

7. The semiconductor memory device according to claim 5, wherein the transistor which is disposed in a different column from the one cache latch is coupled to the one cache latch through a coupling line extending in the first direction and a wiring line extending in the second direction.

8. The semiconductor memory device according to claim 7, wherein the coupling line is configured in a semiconductor layer or a gate layer which is used for the construction of the non-inverted data output transistor and the inverted data output transistor.

9. The semiconductor memory device according to claim 1,
wherein the memory cell array is disposed on a source plate, and
wherein the page buffer circuit and the cache latch circuit are disposed on a substrate below the source plate.

10. The semiconductor memory device according to claim 1, further comprising:
a memory chip including the memory cell array, and defined with a first pad coupled with the memory cell array, on one surface thereof; and
a circuit chip comprising a logic circuit including the page buffer circuit and the cache latch circuit, and defined with a second pad coupled with the logic circuit, on one surface thereof,
wherein the one surface of the memory chip and the one surface of the circuit chip are bonded with each other such that the first pad and the second pad are coupled with each other.

11. A semiconductor memory device comprising:
a plurality of cache latches accessed to a memory cell array through a plurality of bit lines which extend in a second direction intersecting with a first direction, and including a first cache latch and a second cache latch which are disposed in the second direction;
a local sense amplifier disposed between the first cache latch and the second cache latch; and
a plurality of column selection sections including a first column selection section, which is disposed between the local sense amplifier and the first cache latch, and is coupled to the first cache latch through a first wiring line, and a second column selection section, which is disposed between the local sense amplifier and the second cache latch, and is coupled to the second cache latch through a second wiring line,
wherein the first wiring line and the second wiring line do not overlap with the local sense amplifier in a vertical direction perpendicular to the first direction and the second direction.

12. The semiconductor memory device according to claim 11, wherein each of the plurality of column selection sections comprises:
a non-inverted data output transistor coupled between a non-inverting node of one of the plurality of cache latches and a data line, to output a signal of the non-inverting node to the data line in response to a column select signal; and
an inverted data output transistor coupled between an inverting node of the one cache latch and an inverted data line, to output a signal of the inverting node of the one cache latch to the inverted data line in response to the column select signal.

13. The semiconductor memory device according to claim 12, wherein the data output transistor and the inverted data output transistor included in one of the plurality of column selection sections are disposed adjacent to each other in the first direction.

14. The semiconductor memory device according to claim 12, wherein one of the non-inverted data output transistor and the inverted data output transistor coupled to one of the plurality of cache latches is disposed in the same column as the one cache latch, and the other is disposed in a different column from the one cache latch.

15. The semiconductor memory device according to claim 14, wherein the transistor which is disposed in the same column as the one cache latch is coupled to the one cache latch through a wiring line extending in the second direction.

16. The semiconductor memory device according to claim 14, wherein the transistor which is disposed in a different column from the one cache latch is coupled to the one cache latch through a coupling line extending in the first direction and a wiring line extending in the second direction.

17. The semiconductor memory device according to claim 15, wherein the coupling line is configured in a semiconductor layer or a gate layer which is used in realizing the column selection sections.

* * * * *